US012581242B2

(12) United States Patent
Egami

(10) Patent No.: US 12,581,242 B2
(45) Date of Patent: Mar. 17, 2026

(54) SPEAKER

(71) Applicant: Alps Alpine Co., Ltd., Tokyo (JP)

(72) Inventor: Katsuhiko Egami, Fukushima (JP)

(73) Assignee: ALPS ALPINE CO., LTD., Tokyo (JP)

( * ) Notice: Subject to any disclaimer, the term of this patent is extended or adjusted under 35 U.S.C. 154(b) by 153 days.

(21) Appl. No.: 18/444,152

(22) Filed: Feb. 16, 2024

(65) Prior Publication Data

US 2024/0284105 A1 Aug. 22, 2024

(30) Foreign Application Priority Data

Feb. 20, 2023 (JP) ................................. 2023-024060

(51) Int. Cl.
| | |
|---|---|
| *H04R 9/02* | (2006.01) |
| *H04R 7/12* | (2006.01) |
| *H04R 9/06* | (2006.01) |
| *H05K 1/18* | (2006.01) |
| *H05K 1/181* | (2026.01) |

(52) U.S. Cl.
CPC ............. *H04R 9/022* (2013.01); *H04R 7/127* (2013.01); *H05K 1/181* (2013.01); *H04R 9/025* (2013.01); *H04R 9/06* (2013.01); *H04R 2207/021* (2013.01)

(58) Field of Classification Search
CPC .......... H04R 9/022; H04R 9/025; H04R 9/06; H04R 7/127; H04R 2207/021; H04R 2207/28; H04R 2400/11; H05K 1/181
See application file for complete search history.

(56) References Cited

U.S. PATENT DOCUMENTS

| | | | | |
|---|---|---|---|---|
| 6,243,472 | B1* | 6/2001 | Bilan | H04R 1/06 |
| | | | | 381/407 |
| 2010/0316249 | A1* | 12/2010 | Kamimura | H04R 9/043 |
| | | | | 381/399 |
| 2014/0348373 | A1 | 11/2014 | Qui | |

FOREIGN PATENT DOCUMENTS

| | | |
|---|---|---|
| EP | 1 414 267 A2 | 4/2004 |
| JP | S61-119489 A | 6/1986 |
| JP | S61-119494 A | 6/1986 |
| JP | H04-53112 Y | 3/1989 |
| JP | H01-149191 A | 6/1989 |

OTHER PUBLICATIONS

B4 Extended European Search Report from EP 24157822, Jun. 24, 2024, 5 pgs.

* cited by examiner

*Primary Examiner* — Sunita Joshi
(74) *Attorney, Agent, or Firm* — Crowell & Morning LLP

(57) ABSTRACT

A through hole is formed in an inner-side yoke making up a magnetic circuit portion, passing therethrough following a vibration direction of a vibration unit, and circuit boards are disposed in the through hole. The circuit boards are disposed with board surfaces thereof following the vibration direction of the vibration unit. Also, an opening area of a middle space across which the circuit boards oppose each other is larger than opening areas of side spaces. Accordingly, flow quantity of air through the through hole can be obtained, increase in air resistance at the time of vibration of the vibration unit can be suppressed, and also wind velocity can be obtained, whereby cooling effects of heat-generating components mounted on the circuit boards can be improved.

14 Claims, 5 Drawing Sheets

SPEAKER

RELATED APPLICATION

The present application claims priority to Japanese Patent Application No. 2023-024060, filed Feb. 20, 2023, the entirety of which is herein incorporated by reference.

BACKGROUND

1. Field

The present disclosure relates to a speaker equipped with a circuit board on which is mounted a heat-generating component.

2. Description of the Related Art

Audio equipment is made up of a speaker and electronic equipment, such as a drive amp for causing the speaker to operate. An integrated speaker, in which a drive amp or the like is installed in a speaker, for effective use of disposing space, is in practical use. This integrated speaker is used for in-vehicle applications, in which restrictions on disposal space are readily applied. However, disposing the speaker that is integrated with the drive amp in a tight space has a problem in that heat generated from heat-generating components included in the drive amp builds up, and further, along with heat generated from a voice coil of the speaker, causes temperature around the speaker to rise.

Accordingly, speakers described in Japanese Unexamined Utility Model Registration Application Publication No. 61-119494 and Japanese Unexamined Utility Model Registration Application Publication No. 1-149191 have heat-generating components making up drive amps disposed so as to be supported by heat-dissipating members frontward of diaphragms, on an opposite side from a side at which magnetic circuit portions are disposed. These structures anticipate applying an airflow, generated in a frontward direction by vibrations of the diaphragms, to the heat-generating components, thereby improving heat dissipation effects.

Speakers disclosed in Japanese Unexamined Utility Model Registration Application Publication No. 61-119489 and Japanese Examined Utility Model Registration Application Publication No. 4-53112 have heat-generating components making up drive amps disposed rearward of diaphragms, along with magnetic circuit portions. Japanese Examined Utility Model Registration Application Publication No. 4-53112 describes using wind occurring due to vibration of the diaphragm, for heat dissipation of the heat-generating component of the drive amp that is positioned rearward.

SUMMARY

The speakers described in Japanese Unexamined Utility Model Registration Application Publication No. 61-119494 and Japanese Unexamined Utility Model Registration Application Publication No. 1-149191 are structured such that, with a sound production direction in the frontward direction, the drive amps and heat dissipation members are positioned on a sound pressure transmission path from the diaphragm. These members impede conveyance of sound pressure emitted from the diaphragm in the frontward direction, causing a diffraction phenomenon on the sound pressure transmission path and so forth, and accordingly this readily becomes a factor in deterioration of sound production characteristics. Also, the speakers disclosed in Japanese Unexamined Utility Model Registration Application Publication No. 61-119489 and Japanese Examined Utility Model Registration Application Publication No. 4-53112 have the drive amp disposed on the same side as the magnetic circuit portions, and accordingly, effectively applying the wind generated due to vibrations of the diaphragms as to the heat-generating components of the drive amp is difficult, and high cooling effects are not readily achieved.

The present disclosure has been made to solve the above conventional problems. It is an object thereof to provide a speaker in which size can be reduced by installing a circuit board on which heat-generating components that make up a drive amp (and so forth) are mounted, and furthermore, in which cooling effects can be improved by effectively applying an airflow to the heat-generating components by vibration of a vibration unit.

According to the present disclosure, a speaker includes a vibration unit, including a diaphragm and a voice coil, and a magnetic circuit portion that applies a magnetic flux to the voice coil. The magnetic circuit portion includes an inner-side yoke, an outer-side yoke that is positioned on an outer side of the inner-side yoke, a magnetic gap that is formed at an opposing portion of the inner-side yoke and the outer-side yoke, and a magnet that positioned on the outer side of the inner-side yoke and that forms the magnetic flux that traverses the voice coil that is positioned in the magnetic gap. A through hole is formed in the inner-side yoke that passes therethrough following a vibration direction of the vibration unit, and a circuit board on which a heat-generating component is mounted is disposed inside the through hole.

In the speaker according to the present disclosure, preferably, a cap that covers an inner space of a coil bobbin that includes the voice coil is provided to the vibration unit. The through hole communicates with a space that is surrounded by the coil bobbin and the cap.

In the speaker according to the present disclosure, preferably, the circuit board is disposed with a board surface thereof following the vibration direction of the vibration unit.

Further, in the speaker according to the present disclosure, preferably, a plurality of circuit boards are provided, and an opposing spacing between one side end portion of two of the circuit boards that oppose each other is narrower than an opposing spacing between another side end portion thereof.

In the above configuration, even more preferably, the heat-generating component is mounted on the circuit boards at a position closer to the one side end portion, at which the opposing spacing is narrower than the another side end portion, at which the opposing spacing is broad.

In the speaker according to the present disclosure, preferably, a shape of the through hole, as projected on a plane perpendicular to an imaginary center line extending following the vibration direction of the vibration unit, is circular, and the imaginary center line is positioned at the center of an opposing width of the two circuit boards.

In the speaker according to the present disclosure, preferably, two of the circuit boards are provided, and an inner space of the through hole is sectioned into a middle space interposed between the two circuit boards, and two side spaces interposed between the respective circuit boards and an inner face of the through hole. An area of the middle space, as projected on a plane perpendicular to an imaginary center line extending following the vibration direction of the vibration unit, is larger than an area of each of the side spaces, as projected on the plane.

Further, in the speaker according to the present disclosure, preferably, the area of the middle space, as projected on the plane, is larger than a sum of the areas of the two side spaces, as projected on the plane.

In the speaker according to the present disclosure, the circuit boards on which the heat-generating components are mounted are disposed in the through hole formed in the inner-side yoke of the magnetic circuit portion, and accordingly, circuit portions making up the drive amp and so forth can be almost completely accommodated within the dimensions of the speaker, thereby realizing a small-sized configuration of a speaker that is integrated with the circuit portions. Also, the circuit boards are not positioned frontward of the diaphragm, and accordingly, sound pressure that is emitted frontward from the diaphragm is not affected by the circuit boards. Further, by airflow that is generated in the through hole by vibration of the vibration unit being applied to the heat-generating components, heat emitted from the heat-generating components can be externally dissipated from the speaker, and cooling effects of the heat-generating components can be improved.

DESCRIPTION OF THE PREFERRED EMBODIMENTS

Figure 1:
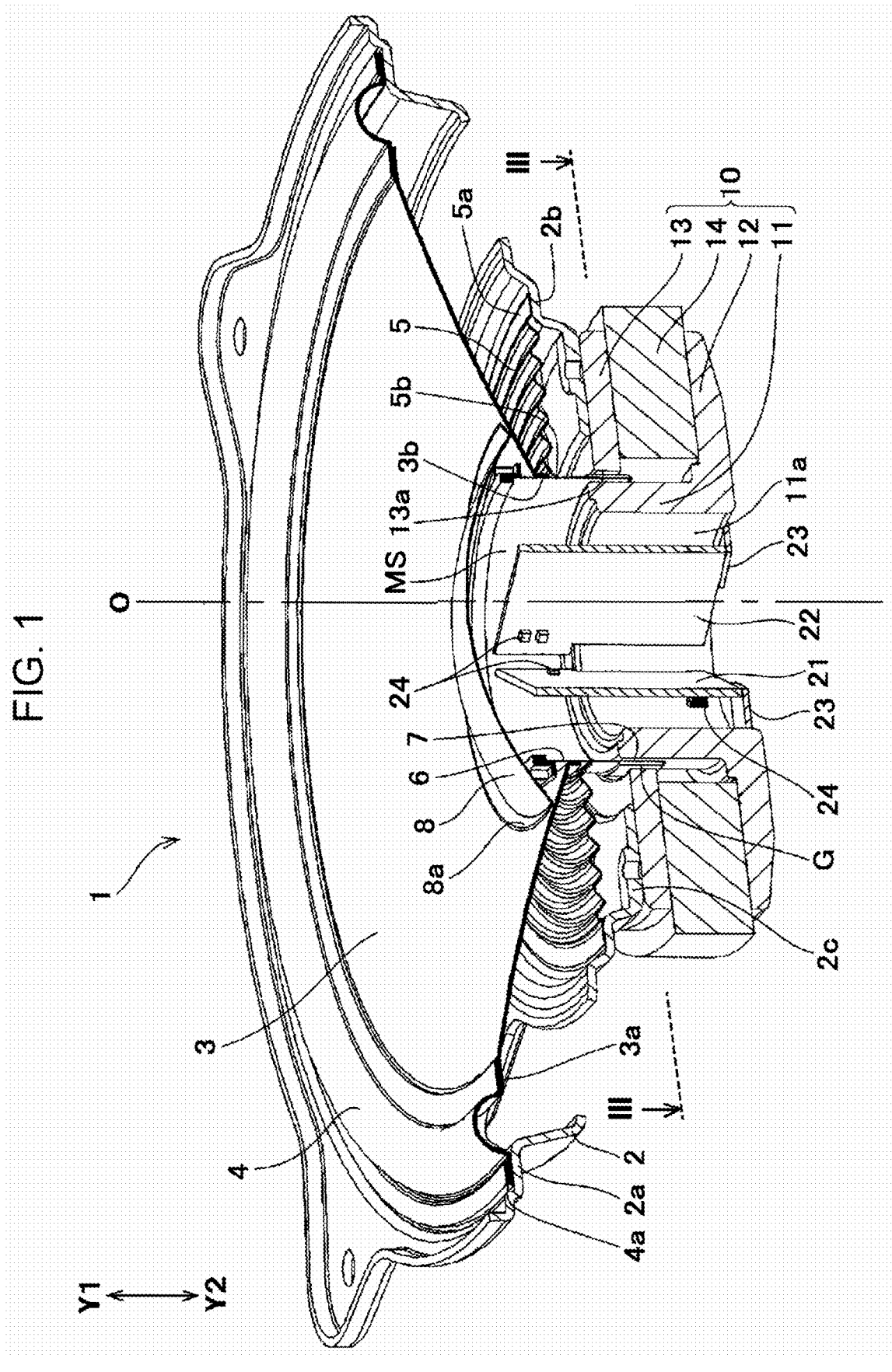
FIG. 1 is a cross-sectional perspective view illustrating a speaker according to a first embodiment of the present disclosure.
Figure 2:
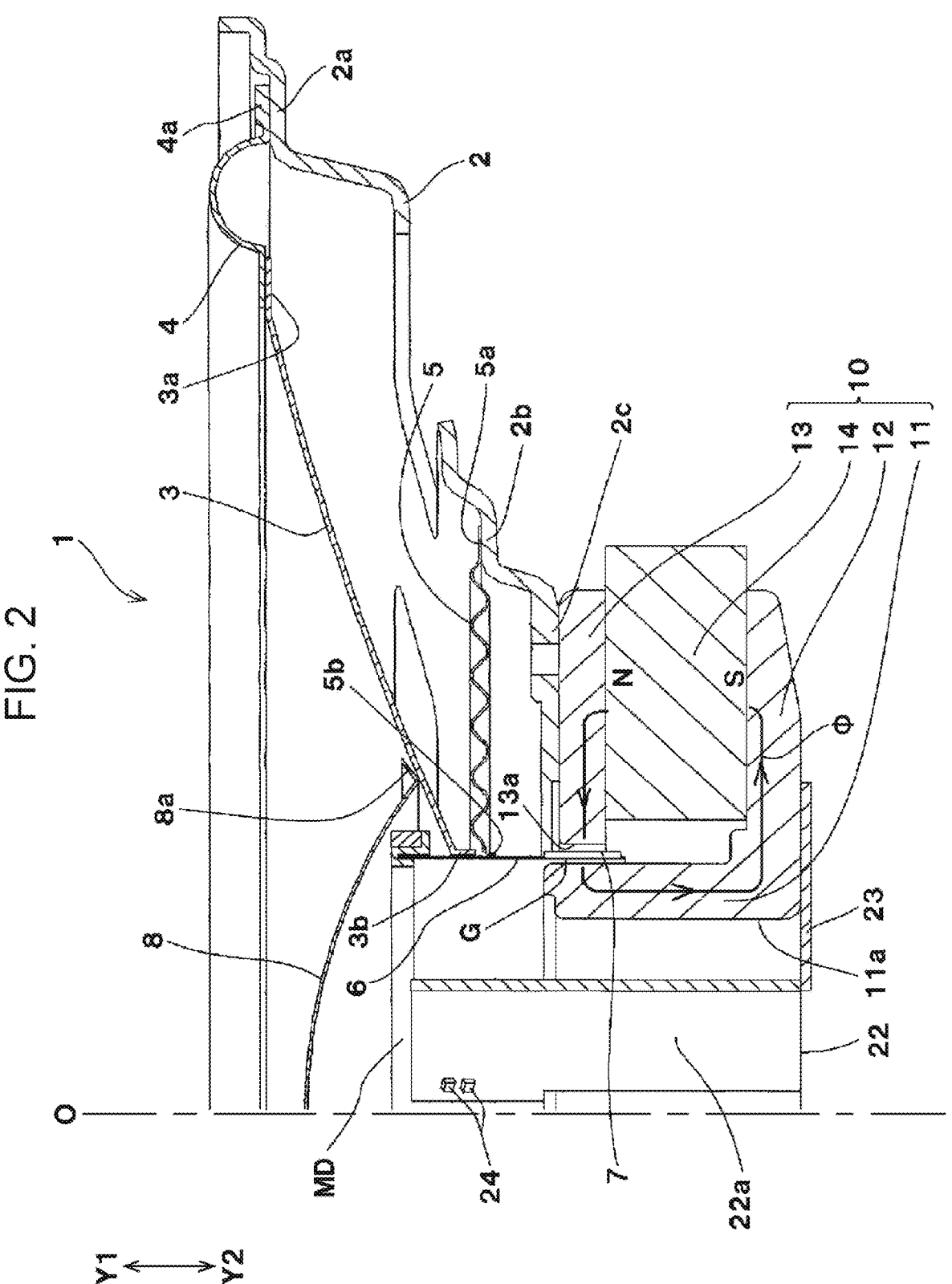
FIG. 2 is a half sectional view of the speaker according to the first embodiment.

An overall structure of a speaker 1 according to an embodiment of the present disclosure is illustrated in FIGS. 1 and 2. The speaker 1 is for in-vehicle application. Note, however, that the speaker 1 can be used for purposes other than in-vehicle application. A Y1-Y2 direction is a front-rear direction of the speaker 1, in which the Y1 direction is frontward and the Y2 direction is rearward. The Y1-Y2 direction is a vibration direction of a vibration unit of which a diaphragm 3 is a principal component. The frontward direction (Y1 direction) of the speaker 1 is a sound production direction. Note, however, that the speaker 1 can be used with the rearward direction (Y2 direction) as the sound production direction.

The speaker 1 has a frame 2. The shape of the frame 2 as viewed from the front (Y1 direction) or the rear (Y2 direction) is circular. The diaphragm 3 is supported on the inner portion of the front of the frame 2. The diaphragm 3 is conical in shape, and the shape thereof as viewed from the front or the rear is circular. Note, however, that the shapes of the frame 2 and the diaphragm 3 as viewed from the front or the rear may be an elongated circle or an ellipse. An edge member 4 that is elastically deformable is joined to an outer circumferential end 3a of the diaphragm 3 by an adhesive agent, and an outer circumferential end 4a of the edge member 4 is fixed by adhesion to an outer circumferential support portion 2a on a front of the frame 2.

An opening portion is formed in a middle portion of the diaphragm 3. An edge portion 3b of the opening portion is circular, as viewed from the front or the rear. A coil bobbin 6 that is cylindrical in shape is positioned in the opening portion of the diaphragm 3, and the edge portion 3b of the opening portion is fixed by adhesion to an outer circumferential face of the coil bobbin 6. A voice coil 7 is provided on an outer circumferential face of the coil bobbin 6, at a rearward (Y2 direction) end portion thereof. A covered conducting wire that makes up the voice coil 7 is wound a predetermined number of turns on the outer circumferential face of the coil bobbin 6. An imaginary center line O is illustrated in FIGS. 1 and 2. The imaginary center line O passes through the center of the opening portion of the diaphragm 3 and the center of a cylinder of the coil bobbin 6, and extends following the Y1-Y2 direction that is the vibration direction of the diaphragm 3. A damper member 5 that is elastically deformable, and that is corrugated in cross-sectional view in FIGS. 1 and 2, is provided inside the frame 2. An outer circumferential portion 5a of the damper member 5 is fixed by adhesion to an intermediate support portion 2b provided at an intermediate portion of the frame in the front-rear direction. An opening portion that is circular, as viewed from the front or the rear, is formed at a middle portion of the damper member 5, and an edge portion 5b of this opening portion is fixed by adhesion to the outer circumferential face of the coil bobbin 6.

A cap 8 is fixed to a front face of the middle portion of the diaphragm 3. The cap 8 has a dome shape with a protruding direction directed frontward, and a circumferential edge portion 8a is fixed by adhesion to a frontal face of the diaphragm 3 that faces frontward. The diaphragm 3 and the cap 8, and the coil bobbin 6 and the voice coil 7, are supported so as to be capable of vibration in the front-rear direction (Y1-Y2 direction), as to the frame 2, by elastic deformation of the edge member 4 and the damper member 5. The diaphragm 3 and the cap 8, and the coil bobbin 6 and the voice coil 7, make up a vibration unit that vibrates in the front-rear direction with respect to a drive supporting unit including the frame 2.

A magnetic circuit portion 10 is fixed to a rear face of a rear support portion 2c of the frame 2, by measures such as adhesion, screwing, or the like. The magnetic circuit portion 10 is for forming a magnetic flux that traverses the voice coil 7. The frame 2 and the magnetic circuit portion 10 make up the drive supporting unit that supports the vibration unit so as to be capable of vibration.

The magnetic circuit portion 10 has an inner-side yoke 11. A rear supporting yoke 12 is integrally formed at a rear portion of the inner-side yoke 11. Note that the inner-side yoke 11 and the rear supporting yoke 12 may be formed separately from each other, and be fixed to each other. The magnetic circuit portion 10 further has an outer-side yoke 13 and a magnet 14. The inner-side yoke 11, the rear supporting yoke 12, and the outer-side yoke 13 are made of magnetic material such as a ferrous metal material or the like. The rear supporting yoke 12 has a shape of a disc that spreads toward an outer side from an outer circumference of the inner-side yoke 11. The outer-side yoke 13 has a ring shape, in which a circular hole is formed in the center portion of a disc, and is positioned on the outer side of the inner-side yoke 11. The magnet 14 has a ring shape, and is positioned on the outer side of the inner-side yoke 11. The magnet 14 is interposed between the rear supporting yoke 12 and the outer-side yoke 13 in the front-rear direction.

A gap between an inner circumferential face 13a of the hole at the center portion of the outer-side yoke 13 and an outer circumferential face of the inner-side yoke 11 functions as a magnetic gap G, and the voice coil 7 is positioned within the magnetic gap G. The magnet 14 is magnetized in the front-rear direction (Y1-Y2), and in the embodiment illustrated in FIG. 2, a face of the magnet 14 that faces frontward (Y1 direction) is the N pole, and a face thereof that faces rearward (Y2 direction) is the S pole. FIG. 2 illustrates a path of a magnetic flux Φ through the magnetic circuit portion 10. The magnetic flux Φ starts from the N pole of the magnet 14, passes through the outer-side yoke 13, traverses the voice coil 7 positioned within the magnetic gap G, passes through the rear supporting yoke 12 from the inner-side yoke 11, and returns to the S pole of the magnet 14.

Figures 3A, 3B:
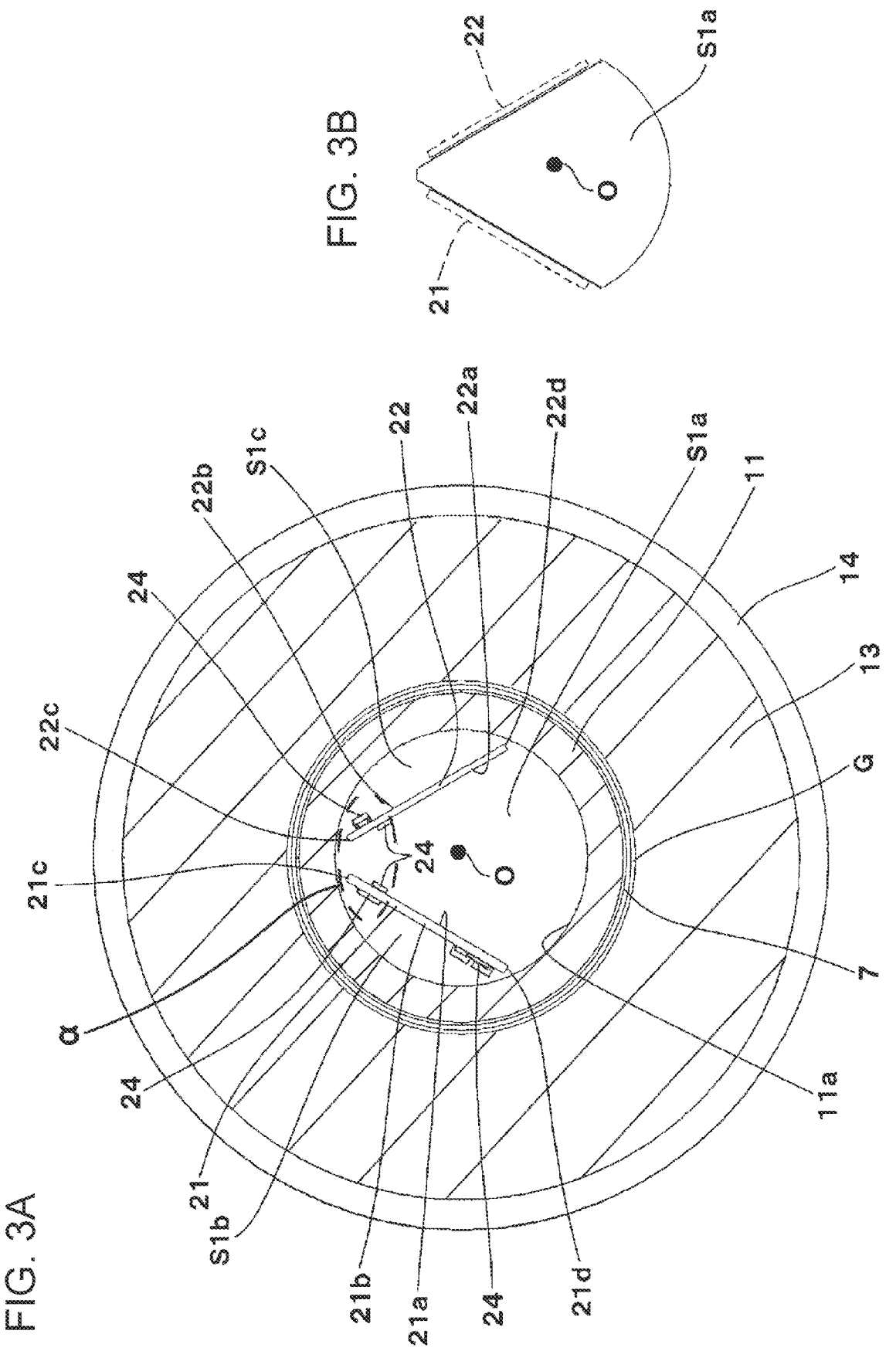
FIG. 3A is a cross-sectional view of a speaker according to the first embodiment, taken along line III-III.
FIG. 3B is an explanatory diagram in which a middle space in a through hole illustrated in FIG. 3A is projected on a plane.

The inner-side yoke 11 has a through hole 11a at the center portion thereof. As illustrated in FIG. 3A, the shape of an edge portion of the through hole 11a as projected on a plane perpendicular to the imaginary center line O is circular, and the imaginary center line O passes through the center of the circle (center of diagram). A plurality of circuit boards are positioned inside of the through hole 11a, which are two circuit boards 21 and 22 in the speaker 1 according to the present embodiment. A supporting member 23 is fixed to a rear face of the rear supporting yoke 12 making up the magnetic circuit portion 10, as illustrated in FIG. 1, and rear end portions of the circuit boards 21 and 22 are each fixed to the supporting member 23. The area of the supporting member 23 as projected on a plane perpendicular to the imaginary center line O is preferably small, so as to not impede air flowing through the through hole 11a.

Electronic components 24 are mounted on board surfaces of each of the circuit boards 21 and 22. The electronic components 24 mounted on the circuit boards 21 and 22 form electronic circuits such as a drive amp and so forth, for causing the speaker 1 to operate, and heat-generating components are included in the electronic components 24. Heat-generating components are integrated circuits (ICs) making up power source circuits, ICs making up central processing units (CPUs), coil components, resistors, and so forth.

FIG. 3A illustrates disposed structures of the circuit boards 21 and 22 in the speaker 1 according to a first embodiment. The circuit board 21 has a board surface 21a on an inner side thereof and a board surface 21b on an outer side thereof, and the circuit board 22 has a board surface 22a on the inner side thereof and a board surface 22b on the outer side thereof. The board surfaces 21a and 21b of the circuit board 21, and the board surfaces 22a and 22b of the circuit board 22 are disposed so as to follow the vibration direction (Y1-Y2) of the vibration unit including the diaphragm 3, and the board surfaces 21a and 21b, and the board surfaces 22a and 22b, are parallel to the imaginary center line O.

In the through hole 11a, the board surface 21a of the circuit board 21 and the board surface 22a of the circuit board 22 oppose each other, and the imaginary center line O is positioned at the center of an opposing width across which the board surface 21a and the board surface 22a oppose each other. That is to say, a perpendicular distance from the imaginary center line O to the board surface 21a, and a perpendicular distance from the imaginary center line O to the board surface 22a are equal, as projected on a plane perpendicular to the imaginary center line O. In the first embodiment illustrated in FIG. 3A, the board surface 21a of the circuit board 21 and the board surface 22a of the circuit board 22 are not parallel. Instead, an opposing distance between a side end portion 21c on one side of the circuit board 21, and a side end portion 22c on one side of the circuit board 22 is narrower than an opposing distance between a side end portion 21d on the other side of the circuit board 21 and a side end portion 22d on the other side of the circuit board 22.

Inside of the through hole 11a is sectioned into a middle space S1a that is interposed between the board surface 21a on the inner side of the circuit board 21, and the board surface 22a on the inner side of the circuit board 22, and that is also surrounded by an inner face of the through hole 11a, a side space S1b that is interposed between the board surface 21b on the outer side of the circuit board 21 and the inner face of the through hole 11a, and a side space S1c that is interposed between the board surface 22b on the outer side of the circuit board 22 and the inner face of the through hole 11a. As illustrated in FIG. 3B, the shape of the middle space S1a, as projected on a plane perpendicular to the imaginary center line O, is substantially fan-shaped. The area of the middle space S1a, as projected on this plane, is larger than the area of the side space S1b, and also is larger than the area of the side space S1c. The area of the middle space S1a is preferably larger than the sum of the area of the side space S1b and the area of the side space S1c.

Figures 4A, 4B:
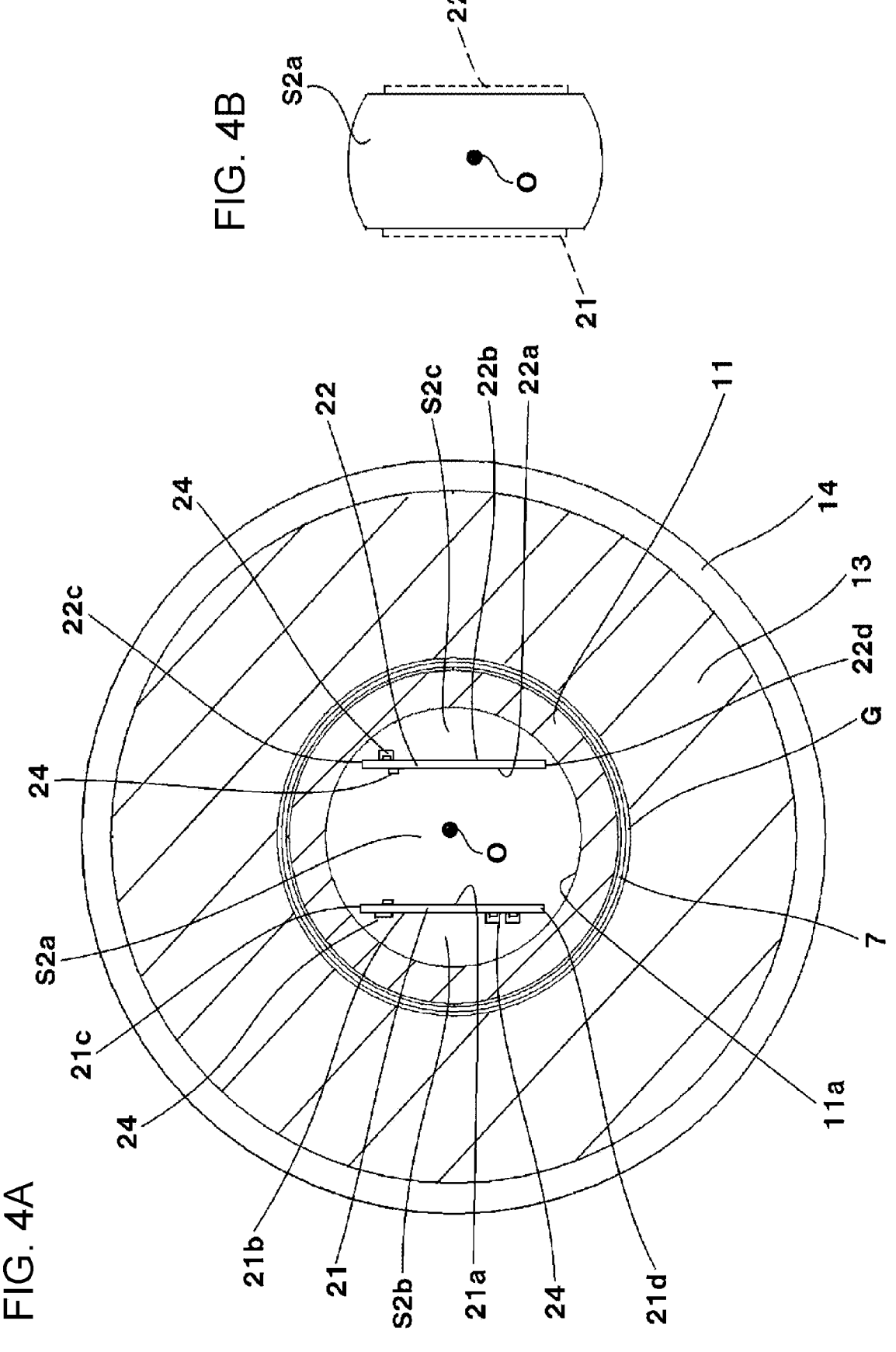
FIG. 4A is a cross-sectional view corresponding to FIG. 3A, illustrating a speaker according to a second embodiment.
FIG. 4B is an explanatory diagram in which a middle space in a through hole illustrated in FIG. 4A is projected on a plane.

In a second embodiment illustrated in FIG. 4A, the board surface 21a on the inner side of the circuit board 21 and the board surface 22a on the inner side of the circuit board 22 are parallel to each other. The imaginary center line O is positioned at the center of the opposing width across which the board surface 21a and the board surface 22a oppose each other. As illustrated in FIG. 4B, the shape of a middle space S2a, as projected on a plane perpendicular to the imaginary center line O, is substantially rectangular in the second embodiment. In the second embodiment as well, the area of the middle space S2a, as projected on this plane, is larger than the area of a side space S2b, and also is larger than the area of a side space S2c. The area of the middle space S2a is preferably larger than the sum of the area of the side space S2b and the area of the side space S2c.

Next, sound production operations of the speaker 1 will be described. In this speaker 1, electronic circuits such as the drive amp are made up of the electronic components 24 mounted to the circuit boards 21 and 22, and accordingly, voice current flowing to the voice coil 7 is controlled by the electronic circuits. Electromagnetic force of a current amount flowing to the voice coil 7 and the magnetic flux Φ traversing the voice coil 7 in the magnetic gap G applies vibration force to the voice coil 7 in the front-rear direction (Y1-Y2 direction), whereby the vibration unit including the diaphragm 3 and the cap 8 vibrates, and sound pressure is emitted frontward (Y1 direction) toward where a listener is positioned. Alternatively, sound pressure may be applied to a listener positioned rearward (Y2 direction) from the diaphragm 3.

In this speaker 1, when the vibration unit including the cap 8 and the diaphragm 3 vibrates, space surrounded by an inner face of the cap 8 and an inner circumferential face of the coil bobbin 6 serves as an operation space MS inside which the vibration unit moves in the front-rear direction. The magnetic gap G is an extremely narrow gap and is negligible, and accordingly, the operation space and inner space of the through hole 11a integrally communicate with substantially no interposition of the gap. Accordingly, inner change of the operation space MS directly acts on the inside of the through hole 11*a*, such that when the vibration unit vibrates in the front-rear direction, a relatively great flow of air in the front-rear direction can be formed inside the through hole 11*a* in accordance with movement in the operation space MS. Heat that is generated from the heat-generating components out of the electronic components 24 mounted on the circuit boards 21 and 22 is discharged rearward (Y2 direction) from the through hole 11*a* due to this airflow, and accordingly, cooling effects of the heat-generating components can be improved.

The circuit board 21 and the circuit board 22 are disposed with the board surfaces thereof parallel to the imaginary center line O, following the front-rear direction. As illustrated in FIGS. 3A and 4A, as projected on a plane perpendicular to the imaginary center line O, the proportion of cross-sectional areas of the circuit boards 21 and 22 as to an opening area of the through hole 11*a* is small. Accordingly, the movement of air through the through hole 11*a* when the operation space MS vibrates in the front-rear direction is hardly impeded at all by the circuit boards 21 and 22, and the presence of the circuit boards 21 and 22 does not increase the load when the vibration unit vibrates.

There is a problem in which the voice coil 7, through which alternating current flows, generates heat while the speaker 1 is operating. However, in the through hole 11*a*, airflows are formed not only in the middle spaces S1*a* and S2*a*, but also in the side spaces S1*b*, S1*c*, S2*b*, and S2*c*, thereby cooling the inner-side yoke 11 from the inner face side of the through hole 11*a*, and accordingly, abnormal heating by the voice coil 7 can be suppressed. Also, an arrangement is preferably made in which a magnetic sensor is provided to the frame 2 or the magnetic circuit portion 10 that make up the drive supporting unit, and a small-sized magnet is provided to the coil bobbin 6 or the diaphragm 3 making up the vibration unit, so that operation positions of the vibration unit can be detected by detection output from the magnetic sensor. Optimizing the voice current applied to the voice coil 7 on the basis of the detection output, by an optimization algorithm set in the drive amp made up of the circuit boards 21 and 22, enables excessive heat generation by the voice coil 7 itself to be suppressed during operation of the speaker 1. Thus, effects of heating of the voice coil 7 on the heat-generating components situated in the through hole 11*a* of the inner-side yoke 11 can be reduced, and cooling effects of the heat-generating components can be improved.

Figure 5A:
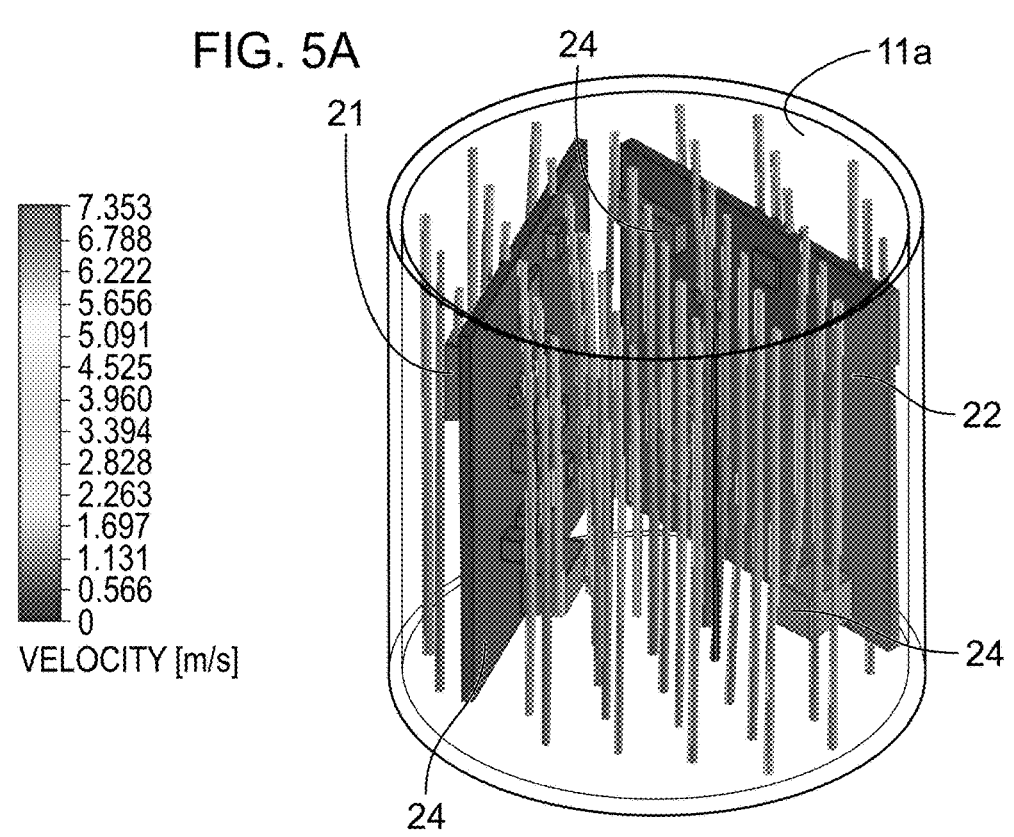
FIG. 5A is an explanatory diagram for describing airflow in the through hole in the first embodiment; and, FIG. 5B is an explanatory diagram for describing airflow in the through hole in the second embodiment.
Figure 5B:
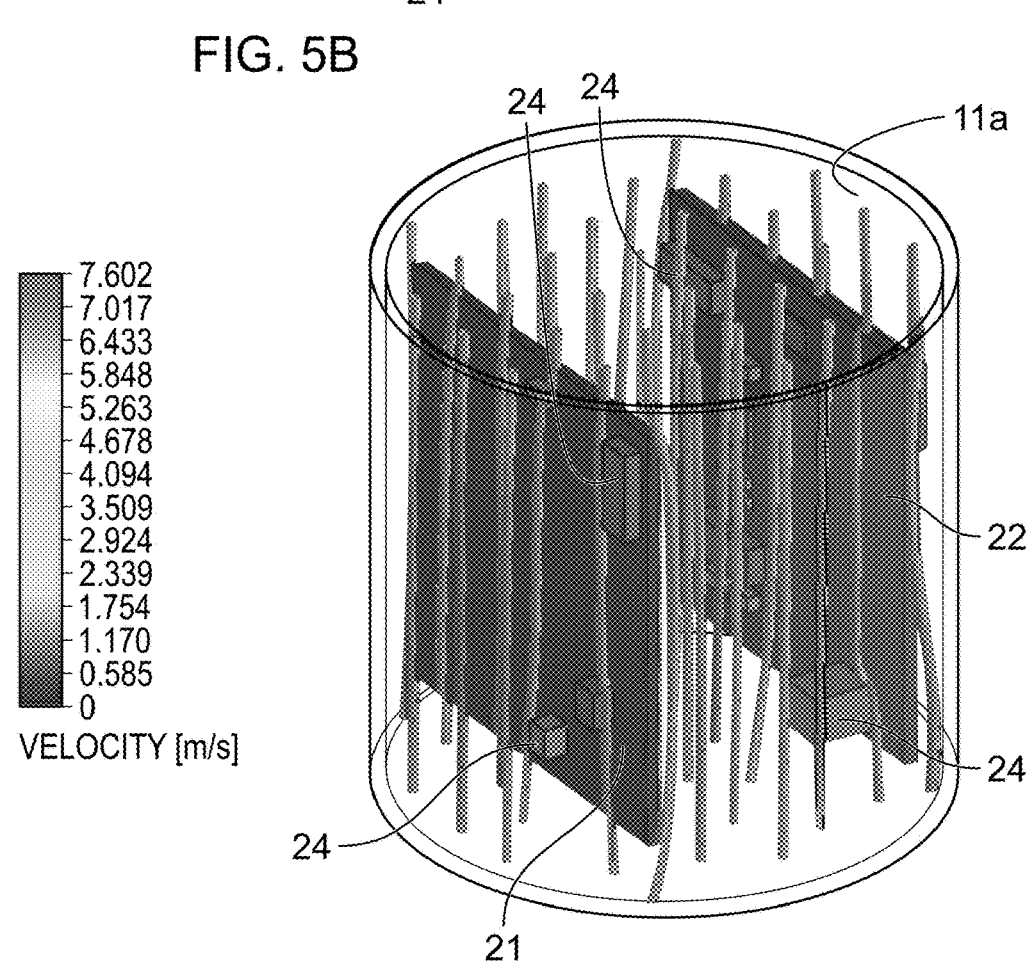

FIG. 5A illustrates wind velocity distribution in the through hole 11*a* of the speaker 1 according to the first embodiment, and FIG. 5B illustrates wind velocity distribution of air in the through hole 11*a* according to the second embodiment. FIGS. 5A and 5B both are simulation results illustrating wind velocity distribution in which an inner diameter of the through hole 11*a* is 60 mm, the cap 8 portion vibrates in the front-rear direction with an amplitude of 14 mm, and an airflow with an average wind velocity of 5 m/s is generated in the through hole 11*a*.

Assuming a situation in which the circuit boards 21 and 22 are not present in the through hole 11*a*, a distribution is manifested in which the wind velocity and flow quantity of air in the through hole 11*a* are the greatest at the imaginary center line O, and gradually decrease toward the inner face of the through hole 11*a*. As illustrated in FIG. 3A, in the speaker 1 according to the first embodiment, the area of the middle space S1*a* including the imaginary center line O as projected on the plane is larger than the area of either of the side space S1*b* and the side space S1*c*, and preferably the area of the middle space S1*a* is larger than the sum of the area of the side space S1*b* and the area of the side space S1*c*. Due to the opening area of the middle space S1*a* where the flow quantity is greatest being made large in this way, resistance force acting on the flow of air near the imaginary center line O in the middle space S1*a* can be reduced even when the circuit boards 21 and 22 are present, and the flow quantity of air within the middle space S1*a* can be maintained at a great level, as illustrated in FIG. 5A. Accordingly, increase in air resistance in the through hole 11*a* when the cap 8 and the diaphragm 3 vibrate in the front-rear direction can be suppressed, and the diaphragm 3 can be made to operate in a stable manner. Also, an airflow can be formed in the through hole 11*a* without very much resistance, and accordingly, cooling effects of the heat-generating components mounted on the circuit boards 21 and 22 can be improved.

As illustrated in FIGS. 4A and 4B, in the second embodiment as well, the area of the middle space S2*a*, as projected on the plane, is larger than the area of either of the side space S2*b* and the side space S2*c*, and preferably the area of the middle space S2*a* is larger than the sum of the area of the side space S2*b* and the area of the side space S2*c*. The opening area of the middle space S2*a* at which the flow quantity is greatest is large, and accordingly as illustrated in FIG. 5B, the flow quantity in the middle space S2*a* is not diminished even when the circuit boards 21 and 22 are present therein, and increase in air resistance in the through hole 11*a* when the cap 8 and the diaphragm 3 vibrate in the front-rear direction can be suppressed. Also, due to the flow quantity of air being great, cooling effects of the heat-generating components mounted on the circuit boards 21 and 22 can also be improved.

In FIGS. 3A and 4A, the circuit boards 21 and 22 are disposed such that the distance from the side end portion 21*c* and 21*d* of the circuit board 21, to the inner face of the through hole 11*a*, and the distance from the side end portion 22*c* and 22*d* of the circuit board 22 to the inner face thereof, are the same in the first embodiment and the second embodiment. FIG. 3B illustrates the shape of the middle space S1*a* projected on the plane in the first embodiment, and FIG. 4B illustrates the shape of the middle space S2*a* projected on the plane in the second embodiment. In the first embodiment illustrated in FIGS. 3A and 3B, the circuit board 21 and the circuit board 22 are disposed with the board surfaces 21*a* and 22*a* being non-parallel, such that the opposing distance between one side end portion 21*c* and 22*c* is narrow, and the opposing distance between the other side end portion 21*d* and 22*d* is great. The area of the middle space S1*a* in the first embodiment, illustrated in FIG. 3B, and the area of the middle space S2*a* in the second embodiment, illustrated in FIG. 4B, are the same, but the region over which an opposing distance W between the board surface 21*a* and the board surface 22*a* in a lateral direction in the drawings is long, is broader in the first embodiment illustrated in FIG. 3B, as compared to in the second embodiment.

As a result, in the simulation results, the flow quantity of air in the middle space S1*a* according to the first embodiment in which the circuit boards 21 and 22 are non-parallel, as illustrated in FIG. 5A, is greater than the flow quantity of air in the middle space S2*a* according to the second embodiment in which the circuit boards 21 and 22 are parallel, as illustrated in FIG. 5B. Accordingly, air resistance when the vibration unit vibrates in the front-rear direction can be reduced in the first embodiment illustrated in FIGS. 3A and 3B, relative to the second embodiment illustrated in FIGS. 4A and 4B.

In the first embodiment illustrated in FIGS. 3A, 3B, and 5A, the circuit boards 21 and 22 are non-parallel, and accordingly, the wind velocity in the middle space S1*a* is greater in a proximal region α, where the opposing distance of the board surface 21*a* and the board surface 22*a* is small, and the circuit boards 21 and 22 are in close proximity than other regions. According to the simulation, the average wind velocity in the proximal region α is around 5.8 m/s, whereas the average wind velocity at the middle space S2*a* when the circuit boards 21 and 22 are parallel is around 5.3 m/s. Accordingly, mounting the heat-generating components on the board surface 21*a* on the inner side of the circuit board 21 and the board surface 22*a* of the circuit board 22 in the proximal region α enables cooling effects of these heat-generating components to be improved. Thus, in the first embodiment, the heat-generating components are preferably mounted on the board surface 21*a* of the circuit board 21 at positions closer to the side end portion 21*c* than to the side end portion 21*d*, and the heat-generating components are preferably mounted on the board surface 22*a* of the circuit board 22 at positions closer to the side end portion 22*c* than to the side end portion 22*d*.

Also, in the through hole 11*a*, the velocity of air flowing through inside of the side spaces S1*b*, S1*c*, S2*b*, and S2*c*, which have small opening areas, is also faster, and accordingly, cooling effects by the airflow with a faster wind velocity can be anticipated when mounting the heat-generating components on the board surfaces 21*b* and 22*b* on the outer sides of the circuit boards 21 and 22, as well.

What is claimed is:

1. A speaker, comprising:
a vibration unit, including a diaphragm and a voice coil; and
a magnetic circuit portion that applies a magnetic flux to the voice coil,
wherein the magnetic circuit portion includes an inner-side yoke, an outer-side yoke that is positioned on an outer side of the inner-side yoke, a magnetic gap that is formed at an opposing portion of the inner-side yoke and the outer-side yoke, and a magnet that is positioned on the outer side of the inner-side yoke and forms the magnetic flux that traverses the voice coil that is positioned in the magnetic gap,
wherein a through hole formed in the inner-side yoke that passes therethrough following a vibration direction of the vibration unit,
wherein a circuit board on which a heat-generating component is mounted is disposed inside the through hole;
wherein a cap that covers an inner space of a coil bobbin that includes the voice coil is provided to the vibration unit, and
wherein the through hole communicates with an operation space that is surrounded by the coil bobbin and the cap.

2. The speaker according to claim 1, wherein the circuit board is disposed with a board surface thereof following the vibration direction of the vibration unit.

3. The speaker according to claim 2, wherein a plurality of circuit boards are provided, and an opposing spacing between one side end portion of two of the circuit boards that oppose each other is narrower than an opposing spacing between another side end portion thereof.

4. The speaker according to claim 3, wherein the heat-generating component is mounted on the circuit boards at a position closer to the one side end portion at which the opposing spacing is narrow than the another side end portion at which the opposing spacing is broad.

5. The speaker according to claim 2, wherein a shape of the through hole, as projected on a plane perpendicular to an imaginary center line extending following the vibration direction of the vibration unit, is circular, and the imaginary center line is positioned at the center of an opposing width of the two circuit boards.

6. The speaker according to claim 2, wherein
two of circuit boards are provided, and an inner space of the through hole is sectioned into a middle space interposed between the two circuit boards, and two side spaces interposed between the respective circuit boards and an inner face of the through hole, and
an area of the middle space, as projected on a plane perpendicular to an imaginary center line extending following the vibration direction of the vibration unit, is larger than an area of each of the side spaces as projected on the plane.

7. The speaker according to claim 6, wherein the area of the middle space, as projected on the plane, is larger than a sum of the areas of the two side spaces, as projected on the plane.

8. A speaker, comprising:
a vibration unit, including a diaphragm and a voice coil; and
a magnetic circuit portion that applies a magnetic flux to the voice coil,
wherein the magnetic circuit portion includes an inner-side yoke, an outer-side yoke that is positioned on an outer side of the inner-side yoke, a magnetic gap that is formed at an opposing portion of the inner-side yoke and the outer-side yoke, and a magnet that is positioned on the outer side of the inner-side yoke and forms the magnetic flux that traverses the voice coil that is positioned in the magnetic gap,
wherein a through hole formed in the inner-side yoke that passes therethrough following a vibration direction of the vibration unit,
wherein a circuit board on which a heat-generating component is mounted is disposed inside the through hole, and,
wherein the circuit board is disposed with a board surface thereof following the vibration direction of the vibration unit.

9. The speaker according to claim 8, wherein a plurality of circuit boards are provided, and an opposing spacing between one side end portion of two of the circuit boards that oppose each other is narrower than an opposing spacing between another side end portion thereof.

10. The speaker according to claim 9, wherein
a cap that covers an inner space of a coil bobbin that includes the voice coil is provided to the vibration unit, and
the through hole communicates with an operation space that is surrounded by the coil bobbin and the cap.

11. The speaker according to claim 9, wherein the heat-generating component is mounted on the circuit boards at a position closer to the one side end portion at which the opposing spacing is narrow than the another side end portion at which the opposing spacing is broad.

12. The speaker according to claim 8, wherein a shape of the through hole, as projected on a plane perpendicular to an imaginary center line extending following the vibration direction of the vibration unit, is circular, and the imaginary center line is positioned at the center of an opposing width of the two circuit boards.

13. The speaker according to claim 8, wherein two of circuit boards are provided, and an inner space of the through hole is sectioned into a middle space interposed between the two circuit boards, and two side spaces interposed between the respective circuit boards and an inner face of the through hole, and an area of the middle space, as projected on a plane perpendicular to an imaginary center line extending following the vibration direction of the vibration unit, is larger than an area of each of the side spaces as projected on the plane.

14. The speaker according to claim 13, wherein the area of the middle space, as projected on the plane, is larger than a sum of the areas of the two side spaces, as projected on the plane.

* * * * *